United States Patent
Janbu et al.

(10) Patent No.: US 11,233,968 B2
(45) Date of Patent: Jan. 25, 2022

(54) DIGITAL CDS READOUT WITH 1.5 ADC CONVERSIONS PER PIXEL

(71) Applicant: OmniVision Technologies, Inc., Santa Clara, CA (US)

(72) Inventors: Oyvind Janbu, Oslo (NO); Tore Martinussen, Strommen (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/069,330

(22) Filed: Oct. 13, 2020

(65) Prior Publication Data

US 2021/0029320 A1 Jan. 28, 2021

Related U.S. Application Data

(62) Division of application No. 16/296,338, filed on Mar. 8, 2019, now Pat. No. 10,848,703.

(60) Provisional application No. 62/654,925, filed on Apr. 9, 2018.

(51) Int. Cl.
| | |
|---|---|
| H04N 5/357 | (2011.01) |
| H04N 5/225 | (2006.01) |
| H03M 1/46 | (2006.01) |
| H03M 1/12 | (2006.01) |
| H04N 5/378 | (2011.01) |
| H04N 5/374 | (2011.01) |

(52) U.S. Cl.
CPC .......... *H04N 5/378* (2013.01); *H03M 1/1245* (2013.01); *H03M 1/462* (2013.01); *H03M 1/466* (2013.01); *H04N 5/374* (2013.01)

(58) Field of Classification Search
None
See application file for complete search history.

(56) References Cited

U.S. PATENT DOCUMENTS

| 9,041,584 B2 * | 5/2015 | Wang | H03M 1/188 341/172 |
| 2015/0229859 A1 * | 8/2015 | Guidash | H04N 5/378 348/308 |

* cited by examiner

*Primary Examiner* — Mark T Monk (57) ABSTRACT

A CMOS image sensor comprises an array of pixels. A column of the pixel array is coupled to a readout column. The readout column is couple to a readout circuitry (RC) that reads out image data from the pixel array. The RC comprises a sampling switch which is coupled to a 1-column successive approximation register (SAR) analog-to-digital converter (ADC). The 1-column SAR ADC comprises a differential comparator, a local SAR control, and a digital-to-analog converter (DAC). The sampling switch is coupled between a readout column and a non-inverting input of the differential comparator. An image readout method reads one pixel with two conversions through the RC. The RC is operated by the local SAR control to set the DAC based on comparator output, and upon which a reset digital value is obtained and stored. An overall reduced algorithm calculation is achieved herein.

9 Claims, 8 Drawing Sheets

Original:  | 0 | 1 | 2 | 3 | 4 | 5 | 6 | 7 | 8 | 9 | 10 | 11 | 12 | 13 | 14 | 15 |

Mappings:

| | | | | | | | | | | | | | | | | |
|---|---|---|---|---|---|---|---|---|---|---|---|---|---|---|---|---|
| 410 | 0 | 1 | 2 | 3 | 4 | 5 | 6 | 7 | 8 | 9 | 10 | 11 | 12 | 13 | 14 | 15 |
| 420 | 1 | 0 | 3 | 2 | 5 | 4 | 7 | 6 | 9 | 8 | 11 | 10 | 13 | 12 | 15 | 14 |
| 430 | 1 | 3 | 0 | 2 | 5 | 7 | 4 | 6 | 9 | 11 | 8 | 10 | 13 | 15 | 12 | 14 |
| 440 | 0 | 2 | 1 | 3 | 4 | 6 | 5 | 7 | 8 | 10 | 9 | 11 | 12 | 14 | 13 | 15 |

Fig. 4

Original: Input pixels

| R0 | G1 | R2 | G3 | R4 | G5 | R6 | G7 |
|----|----|----|----|----|----|----|----|
| G0 | B1 | G2 | B3 | G4 | B5 | G6 | B7 |
| R0 | G1 | R2 | G3 | R4 | G5 | R6 | G7 |
| G0 | B1 | G2 | B3 | G4 | B5 | G6 | B7 |

Swapped settings: Unmodified readout

|   |    |    |    |    |    |    |    |    |
|---|----|----|----|----|----|----|----|----|
| 0 | R0 | G1 | R2 | G3 | R4 | G5 | R6 | G7 |
| 0 | G0 | B1 | G2 | B3 | G4 | B5 | G6 | B7 |
| 0 | R0 | G1 | R2 | G3 | R4 | G5 | R6 | G7 |
| 0 | G0 | B1 | G2 | B3 | G4 | B5 | G6 | B7 |

Green first, different color

|   |    |    |    |    |    |    |    |    |
|---|----|----|----|----|----|----|----|----|
| 1 | G1 | R0 | G3 | R2 | G5 | R4 | G7 | R6 |
| 0 | G0 | B1 | G2 | B3 | G4 | B5 | G6 | B7 |
| 1 | G1 | R0 | G3 | R2 | G5 | R4 | G7 | R6 |
| 0 | G0 | B1 | G2 | B3 | G4 | B5 | G6 | B7 |

Red/Blue first, different color

|   |    |    |    |    |    |    |    |    |
|---|----|----|----|----|----|----|----|----|
| 0 | R0 | G1 | R2 | G3 | R4 | G5 | R6 | G7 |
| 1 | B1 | G0 | B3 | G2 | B5 | G4 | B7 | G6 |
| 0 | R0 | G1 | R2 | G3 | R4 | G5 | R6 | G7 |
| 1 | B1 | G0 | B3 | G2 | B5 | G4 | B7 | G6 |

Same-color input, static per row

|   |    |    |    |    |    |    |    |    |
|---|----|----|----|----|----|----|----|----|
| 2 | G1 | G3 | R0 | R2 | G5 | G7 | R4 | R6 |
| 3 | G0 | G2 | B1 | B3 | G4 | G6 | B5 | B7 |
| 2 | G1 | G3 | R0 | R2 | G5 | G7 | R4 | R6 |
| 3 | G0 | G2 | B1 | B3 | G4 | G6 | B5 | B7 |

Same-color input, static per row

|   |    |    |    |    |    |    |    |    |
|---|----|----|----|----|----|----|----|----|
| 3 | R0 | R2 | G1 | G3 | R4 | R6 | G5 | G7 |
| 2 | B1 | B3 | G0 | G2 | B5 | B7 | G4 | G6 |
| 3 | R0 | R2 | G1 | G3 | R4 | R6 | G5 | G7 |
| 2 | B1 | B3 | G0 | G2 | B5 | B7 | G4 | G6 |

Same-color input, swapped per row

|   |    |    |    |    |    |    |    |    |
|---|----|----|----|----|----|----|----|----|
| 2 | G1 | G3 | R0 | R2 | G5 | G7 | R4 | R6 |
| 2 | B1 | B3 | G0 | G2 | B5 | B7 | G4 | G6 |
| 2 | G1 | G3 | R0 | R2 | G5 | G7 | R4 | R6 |
| 2 | B1 | B3 | G0 | G2 | B5 | B7 | G4 | G6 |

DIGITAL CDS READOUT WITH 1.5 ADC CONVERSIONS PER PIXEL

CROSS-REFERENCE TO RELATED APPLICATION

This application is a divisional of U.S. patent application Ser. No. 16/296,338, filed on Apr. 9, 2018, now pending. U.S. patent application Ser. No. 16/296,338 is hereby incorporated by reference.

TECHNICAL FIELD

This disclosure relates generally to Complementary Metal-Oxide-Semiconductor (CMOS) image sensors, and in particular but not exclusively, relates to method to reduce the number of analog to digital conversions for Digital Correlated Double Sampling (DCDS) in a CMOS image sensor. A reduction in energy consumption per pixel is achieved as consequence.

BACKGROUND INFORMATION

Image sensors have become ubiquitous. They are widely used in digital still cameras, cellular phones, security cameras, as well as medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important. To achieve higher quality, the increase of the number of pixels within the array provides one solution. To eliminate as much noise in the image data as possible provides the other. A common way in CMOS image sensors to reduce noise is correlated double sampling (CDS). CDS reduces the noise in the signal by calculating the difference between the signal voltage value (image grey value), and a reset signal (image black background noise) for the given pixel. Implementing CDS reduces the fixed pattern noise and other temporal noise from the image data. Correlated double sampling may be done in analog or digital domain.

A system for digital correlated double sampling for an image sensor having a plurality of pixels includes: an analog-to-digital convertor (ADC) stage for converting analog data into digital image data and outputting reset data; memory for storing both the digital image data and the reset data; and a digital correlated double sampling (DCDS) stage for generating digitally correlated double sampled image data based upon the subtraction between the digital image data and the digital reset data.

A method for digital correlated double sampling for an image sensor having a plurality of pixels includes: converting analog image data into digital image data using an analog-to-digital converter (ADC) stage; storing, directly into memory, the digital image data, and the digital reset data from the ADC stage; and generating digital correlated double sampled digital image data based upon the digital image data and digital reset data.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast settling pixel output line in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

A method to reduce the number of analog to digital conversions is needed for Digital Correlated Double Sampling (DCDS) in a CMOS image sensor. The method allows 2 pixels to be read using only 3 analog to digital conversions, i.e. with an average of 1.5 conversions per pixel, compared to 2 conversions per pixel with conventional DCDS. The method also provides the DCDS result directly as an output from the analog to digital conversion, without the need to arithmetically calculate the difference between the signal conversion and reset conversion. The energy consumption per pixel can therefore be reduced. A CMOS image sensor is implemented in a 90 nm technology to demonstrate that the method works as expected.

Figure 1A:
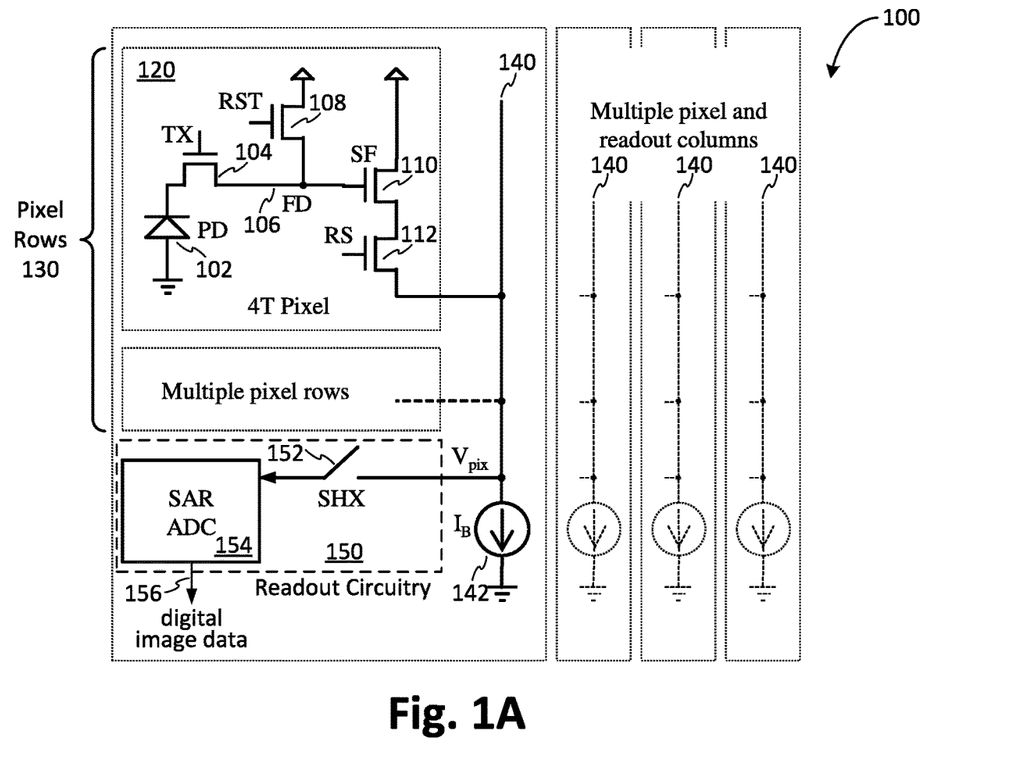
FIG. 1A illustrates a CMOS image sensor with an array of photo diodes in a typical 4T pixel configuration in accordance with an embodiment of the present disclosure.

FIG. 1A illustrates that a CMOS image sensor 100 comprises a pixel array including a plurality of pixels. It is commonly implemented with pinned photo diodes in a typical 4T pixel configuration 120. A plurality of 4T pixels 120 forms a plurality of pixel rows 130 which are read through a plurality of readout columns 140 to a plurality of readout circuitry 150. The digital correlated double sampling (DCDS) processes digital image data from ADC outputs 156 which suppresses the thermal kTC noise and ADC offset of each pixels.

In a conventional 4T pixel configuration 120 with readout circuitry 150 as shown in FIG. 1A, a pinned photo diode (PD) 102 generates image charges in response to incident light. A transfer (TX) transistor 104 enables charge transfer from the PD 102 to a floating diffusion (FD) node 106. A reset (RST) transistor 108 is used to reset the pixel 120. A source follower (SF) transistor 110 and a row select (RS) transistor 112 connect the FD node 106 in the selected pixel row to a per-column shared pixel readout column 140 that carries an output voltage Vpix. A bias current source $I_B$ 142 is used to bias the source follower transistors 110 of each pixels connected to the readout column.

The Vpix output is also connected to a per-column readout circuitry 150, shown in FIG. 1A as a sampling switch (SHX) 152 and a SAR ADC 154. Although in one embodiment, for demonstration purpose, SAR ADCs are focused on because of their high energy efficiency, the scope should not be viewed as limited to SAR ADCs only. Other type of ADCs may also be applicable in other embodiments to the present disclosure.

A pixel row is first pre-charged by asserting both the TX and RST switches. Shortly after that, the de-asserting of both switches initiates the exposure time.

Figure 1B:
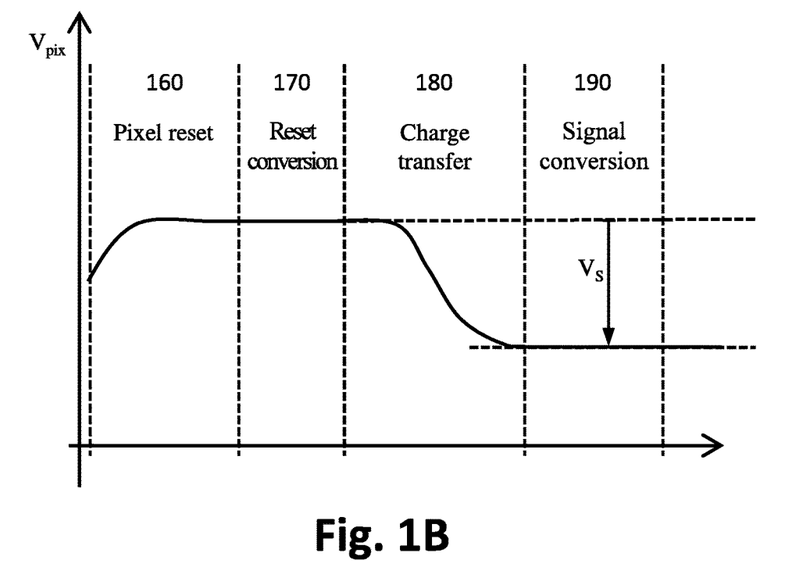
FIG. 1B illustrates a timing diagram of typically conventional Digital Correlated Double Sampling (DCDS) operation for pixel readout in accordance with an embodiment of the present disclosure.

A typically conventional DCDS operation for pixel readout is illustrated in a timing diagram as shown in FIG. 1B. In the "Pixel reset" phase 160, the RST switch 108 is pulsed in order to apply a reset voltage to the floating diffusion (FD) node 106. The Vpix output is then converted to a digital signal during the "Reset conversion" phase 170. The TX gate is pulsed such that charge accumulated in the PD 102 (since the pre-charge operation) is transferred to the FD node 106 during the "Charge transfer" phase 180. This reduces the Vpix pixel output voltage by $V_S$ due to the accumulation of negatively charged electrons on the FD node 106. Finally, the pixel output voltage is sampled during the "Signal conversion" phase 190.

Some phases may partially overlap in a sampled system. For instance, in one embodiment, the charge transfer may start after the reset signal is sampled, but before the reset conversion is completed.

As the DCDS result, a final signal C, is calculated using the signal conversion result Sig and reset conversion result Rst. In the case where redundancy is included in the ADC, a decoding function df( ) must be applied to each ADC code, prior to calculating the difference as shown in equation (1).

$$C = df(Sig) - df(Rst) \tag{1}$$

In order to reduce the energy consumption needed to read pixel data, an updated DCDS operation is disclosed in one embodiment.

Figure 2:
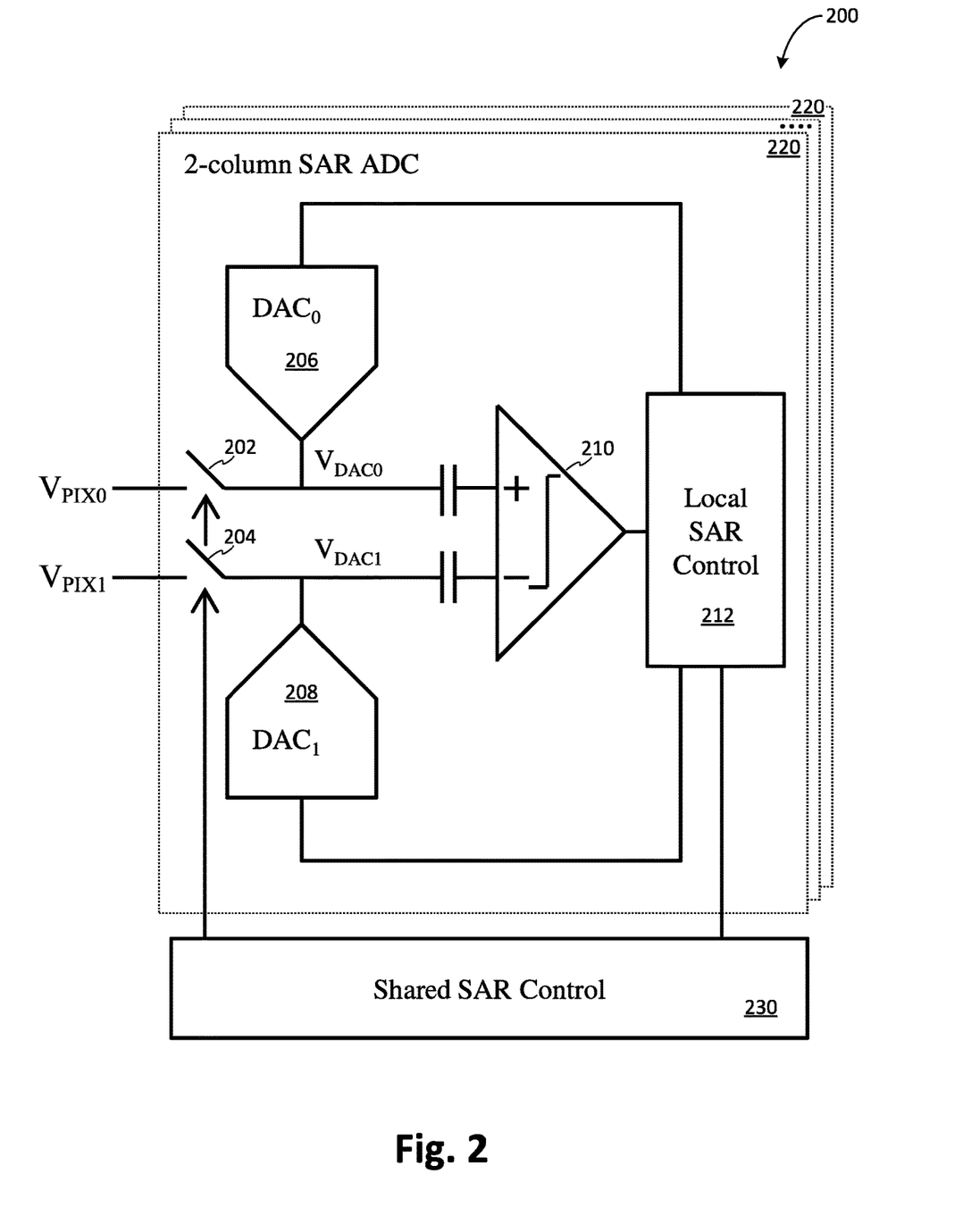
FIG. 2 is a first example 2-column successive approximation register (SAR) ADC that has a comparator of two differential inputs and two digital to analog converters (DACs) to convert pixel analog voltages $V_{PIX0}$ and $V_{PIX1}$ to digital image signals in accordance with an embodiment of the present disclosure.

For a SAR ADC 220 shown in FIG. 2, two pixel columns outputs $V_{PIX0}$ and $V_{PIX1}$ are connected to the differential inputs of a differential comparator 210 of a SAR ADC 220, as shown in FIG. 2. Each SAR ADC 220 is two-pixel-column wide in its physical layout and includes two individually controllable sampling switches 202 and 204. This allows separate sampling of the pixel signals ($V_{PIX0}$ and $V_{PIX1}$) from even and odd columns. The two charge redistribution DACs, $DAC_0$ 206 and $DAC_1$ 208, also serve as input sampling capacitors. Further, the differential comparator 210 of the SAR ADC 220 with AC-coupled inputs and local SAR control logic 212.

A shared SAR control block 230, as shown in FIG. 2, controls the input sampling switches 202 and 204, and the timing of the successive approximation switching algorithm of all column SAR ADCs 220. Let the sampled voltage of an ideal charge redistribution DAC be $V_0$ and let DAC bit n be equal to $x_n$ at the time of sampling. Each bit n has an associated weight $w_n$, relative to the supplied voltage reference $V_{VREF}$. When DAC bit n is later modified to $x_n'$, the DAC output VDAC changes as defined by equation (2).

$$V_{DAC} = V_0 + V_{VREF} \cdot G \cdot \Sigma_{n=0}^{N-1} w_n \cdot (x_n' - x_n) \tag{2}$$

The full DAC voltage swing will be less than VREF due to parasitic capacitance and loading from the comparator. The gain factor G is such that equation (3) is fulfilled.

$$G \cdot \Sigma_{n=0}^{N-1} w_n < 1 \tag{3}$$

Since electrons accumulate negative charge in the pixel, the pixel output will normally change in the negative direction during the charge transfer phase. This is referred to as a positive DCDS result. At the same time, noise in the pixel amplifier, pixel biasing and ADC affect the conversion result such that the DCDS result may be negative. The DAC setting used during sampling can be chosen such that the DAC supports a relatively small negative voltage change and a larger positive voltage change.

Figure 3:
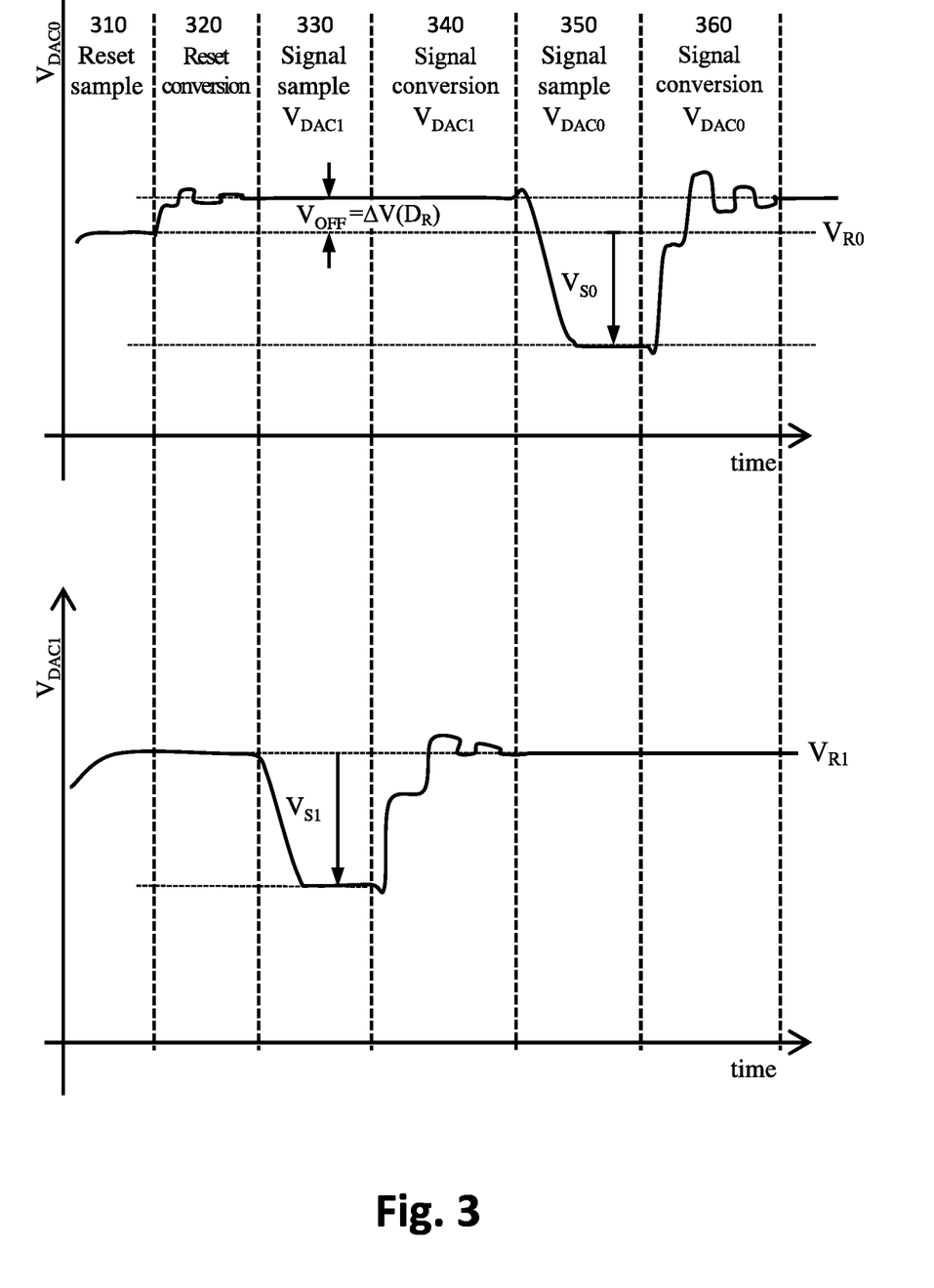
FIG. 3 is a first example waveform in association with the operation of the 2-column SAR ADC in an imaging sensor in dealing with arithmetic calculation in associate with the circuitry of FIG. 2 in accordance with an embodiment of the present disclosure.

The disclosed two-pixel DCDS readout shown in 200 of FIG. 2 is performed in six phases as illustrated in FIG. 3. Firstly, the differential reset signal is sampled onto the differential ADC input during the "Reset sample" phase 310. The even and odd DACs 206 and 208 are initialized with DAC codes ($P_0-P_{n0}$) and ($P_0+P_{n1}$), respectively. $P_0$ is a constant large enough to allow conversion of the comparator offset $V_{OFF}$ (FIG. 3) without clipping (value saturation). $P_0$ and $P_{n1}$ ($P_{n0}$ may be slightly different from $P_{n1}$) are variables smaller than $P_0$, which may be randomly updated (dithered) per row in order to improve the ADC DNL performance. The comparator 210 is also reset during this phase 310 with a pulse, prior to opening the sampling switches 202 and 204.

During the "Reset conversion" phase 320, the comparator input successively approximates the comparator trigger point by stepping $DAC_0$ (refer to the wiggling waveform of $V_{DAC0}$ during Phase 320 in FIG. 3), leaving $V_{DAC1}$ unmodified (i.e., maintained at $V_{DAC1}=V_{R1}$). The final digital equivalent code of $DAC_0$ due to the "Reset conversion" phase 320 is $D_R$ (a reset digital value) and the comparator is close to its trigger point. Near the trigger point, as can be seen from Table 1, $DAC_0$ code has been adjusted from $P_0-P_{n0}$ to $P_0+D_R$. The value of $V_{DAC0}$, as a result, is set from $V_{R0}$ to $V_{R0}+\Delta V(D_R)+\Delta V(P_{n0})$ to minimize the quantization error of $V_{DAC0}-V_{DAC1}$ to $V_{QR}$, where $V_{QR}$ is less than $\Delta V(LSB)$, as found in Table 1, at the end of the conversion of Phase 320, where LSB is the least significant bit of an N bits digital value of either DAC.

TABLE 1

Principal algorithm with DAC codes and voltages

| Phase | $DAC_0$ code | $DAC_1$ code | $V_{DAC0}$ | $V_{DAC1}$ | $V_{DAC0} - V_{DAC1}$ |
|---|---|---|---|---|---|
| 310 | $P_0 - P_{n0}$ | $P_0 + P_{n1}$ | $V_{R0}$ | $V_{R1}$ | |
| 320 | $P_0 + D_R$ | $P_0 + P_{n1}$ | $V_{R0} + \Delta V(D_R) + \Delta V(P_{n0})$ | $V_{R1}$ | $V_{QR}$ |
| 330 | | | | $V_{R1} - V_{S1}$ | |
| 340 | $P_0 + D_R$ | $D_1$ | $V_{R0} + \Delta V(D_R) + \Delta V(P_{n0})$ | $V_{R1} - V_{S1} + \Delta V(D_1) - \Delta V(P_0) - \Delta V(P_{n1})$ | $V_{Q1}$ |
| 350 | $P_0 - D_R$ | | $V_{R0} - V_{S0}$ | | |
| 360 | $D_0$ | $D_1$ | $V_{R0} - V_{S0} - \Delta V(P_0) + \Delta V(D_R) + \Delta V(D_0)$ | $V_{R1} - V_{S1} + \Delta V(D_1) - \Delta V(P_0) - \Delta V(P_{n1})$ | $V_{Q0}$ |

At the end of the ADC conversion phase 320, the successive approximation algorithm will result in small quantization error $V_{QR}$ at the differential comparator input, shown in Table 1. We define a function $\Delta V(x)$ as equation (4), where x is a DAC code.

$$\Delta V(x)=V_{VREF} \cdot G \cdot \Sigma_{n=0}^{N-1} w_n \cdot x_n \tag{4}$$

In the third phase 330, the odd column pixel voltage $V_{PIX1}$ after pixel charge transfer is sampled onto $V_{DAC1}$. The $V_{DAC1}$ voltage is reduced by $V_{S1}$ as indicated by FIG. 3. During the following "Signal conversion" phase 340, $DAC_1$ is successively stepped (refer to the wiggling waveform of $V_{DAC1}$ during Phase 340 in FIG. 3) in order to approximate the odd column pixel charge. The final $DAC_1$ code from this phase is $D_1$. As the comparator reaches its trigger point, seen from Table 1, $DAC_1$ code has been adjusted from $P_0+P_{n1}$ to $D_1$. The value of $V_{DAC1}$, as a result, is set from $V_{R1}-V_{S1}$ to $V_{R1}-V_{S1}+\Delta V(D_1)-\Delta V(P_0)-\Delta V(P_{n1})$ to minimize the quantization error of $V_{DAC0}-V_{DAC1}$ to $V_{Q1}$, where $V_{Q1}$ is less than $\Delta V(LSB)$, found in Table 1, at the end of the conversion of Phase 340.

In the fifth phase 350, the even column sampling switch 202 is opened in order to sample the even column pixel voltage $V_{PIX0}$ onto $V_{DAC0}$. Again, the pixel charge transfer occurs during or before this phase. The $V_{DAC0}$ voltage is reduced by $V_{S0}$ compared to the sampled reset voltage $V_{R0}$ as can be seen from FIG. 3. During the signal sampling phase 350, the $DAC_0$ holds a selected code of $P_0-D_R$, in order to compensate for the comparator offset. The selection of $P_0-D_R$ to $DAC_0$ is the essence of this present disclosure. It makes the $DAC_0$ do the math and removed an arithmetic subtraction between the offset $V_{OFF}$ caused by the reset and the signal (indicated by equation (1)) normally takes place at a later time in digital domain. This is made possible because the offset voltage $\Delta V(D_R)$ represented by the $DAC_0$ code $D_R$ is cancelled out from the final calculation if method hereby disclosed is used.

In the final "Signal conversion" phase 360, $DAC_0$ is successively stepped (refer to the wiggling waveform of $V_{DAC0}$ during Phase 360 in FIG. 3) in order to approximate the even column pixel charge. The final $DAC_0$ code from this phase is Do. As the comparator 210 approaches its trigger point, seen from Table 1, $DAC_0$ code has been adjusted from $P_0-D_R$ to $D_0$. The value of $V_{DAC0}$, as a result, is set from $V_{R0}-V_{S0}$ to $V_{R0}-V_{S0}-\Delta V(P_0)+\Delta V(D_R)+\Delta V(D_0)$ to minimize the quantization error of $V_{DAC0}-V_{DAC1}$ to $V_{Q0}$, where $V_{Q0}$ is less than $\Delta V(LSB)$, as found in Table 1, at the end of the conversion of Phase 360.

The information from Table 1 may be concluded as:

$$\Delta V(D_0)=V_{S0}+V_{Q0}-V_{Q1}+\Delta V(P_0)+\Delta V(P_{n0}) \tag{5}$$

$$\Delta V(D_1)=V_{S1}+V_{QR}-V_{Q1}+\Delta V(P_0)+\Delta V(P_{n1}) \tag{6}$$

Equations (5) and (6) show that the output codes $D_0$ and $D_1$ represent the image pixel signal $V_{S0}$ and $V_{S1}$, respectively, offset by the initial codes $P_0$ and $P_n$ used during the reset sampling phase. Due to the digital CDS operation, each output also includes two quantization errors.

The reset caused offset $\Delta V(D_R)$ is, however, not appeared in either equations (5) or (6). That means the DCDS method provides the DCDS result directly without the need for an arithmetic operation to calculate the subtraction of the reset value from the signal value. That also means that the DCDS method reduces the signal processing needed for decoding of redundancy, in case where an ADC with redundancy is used. To conclude, the disclosed method reads two pixels with 3 ADC conversions. It means that a new reduced to 1.5 ADC conversions per pixel verses 2 ADC conversions per pixel as in a conventional method.

The ADC and proposed algorithm may have an input signal range that is defined by the supplied voltage reference. If $V_{S1}$ is saturated, $V_{Q1}$ may be larger than the normal quantization error. It may be seen from (5) that this will also affect the converted output signal $D_0$. Hence, the saturation of odd column pixels will lead to an error in the conversion of the corresponding even column pixel. This effect may be mitigated by smart post processing of the output data.

The connection between pixel columns and ADC inputs may also be swapped on a per-row basis. For instance, one can always connect green pixels from a Bayer pixel pattern to the $V_{PIX0}$ ADC input. If, for a specific use case, it is known that green pixels are more likely to be saturated than red or blue pixels. This may reduce the effect of saturated $V_{PIX1}$ ADC inputs.

In a different embodiment, pixel columns may be swapped such that each ADC is provided with inputs from the same color pixels.

Figure 4:
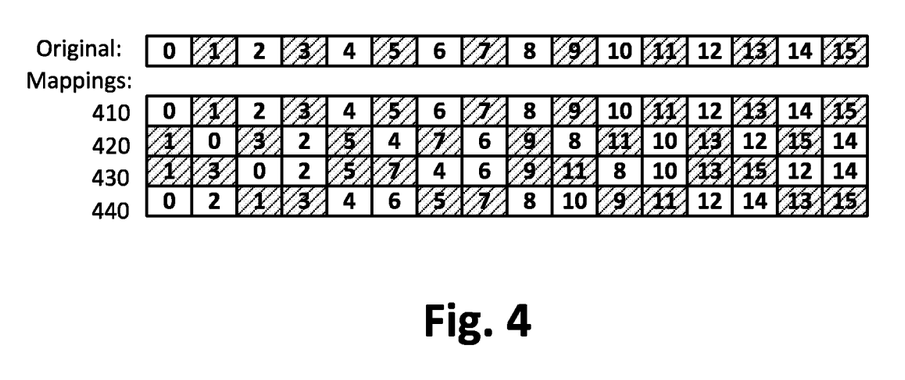
FIG. 4 is an illustrative chart of 4 different settings which allow 4 different mappings or swapping of pixel column outputs to the ADC input within groups of 4 neighbor pixels in associate with the circuitry of FIG. 1A and FIG. 2 in accordance with an embodiment of the present disclosure.

In order to limit complexity, an implementation may, for instance, allow column swapping within groups of 4 neighbor pixels. An example of such swapping is shown in FIG. 4, where 4 different settings allow 4 different mappings 410, 420, 430, 440 from pixel column output to the ADC input.

For column swapping, every two adjacent 2-column SAR ADCs are coupled to every four adjacent readout columns, and wherein each sampling switch of the 2-column SAR ADC is to receive one of the four adjacent readout columns based on which pixel row is under read in the readout sequence of the image sensor.

Figure 5:
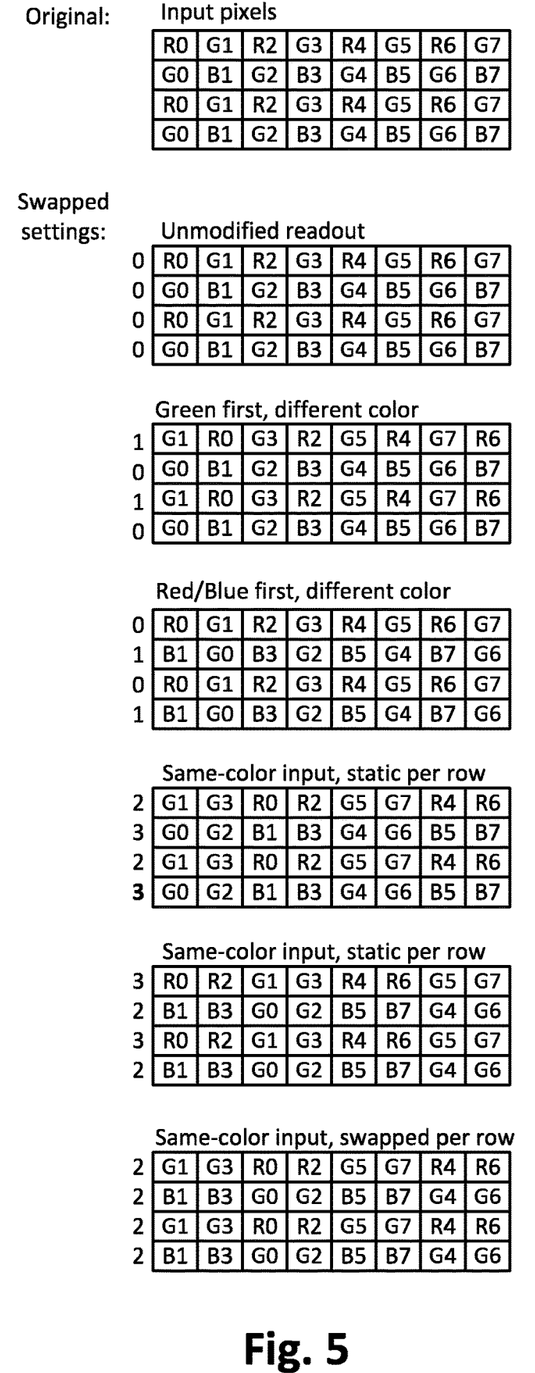
FIG. 5 is an illustrative chart of more useful swapping settings of pixel column outputs to the ADC input within groups of 4 neighbor pixels in associate with the disclosed circuitry and disclosed method to mitigate the clipping effects in accordance with an embodiment of the present disclosure.

Some examples on use of such swapped settings to mitigate the effects of clipping are further shown in FIG. 5.

Although the method of the 1.5-ADC-conversions-per-pixel has power efficiency advantage over the 2-ADC-conversions-per-pixel, it may bear a disadvantage in speed since 3 conversions are needed per pixel row in comparing to 2 for the conventional DCDS method. To regain speed, the 2-ADC-conversions-per-pixel may also be implemented using the method disclosed for the 1.5-ADC-conversions-per-pixel above.

In order to improve speed needed to read pixel data, a second DCDS operation is disclosed in another embodiment.

Figure 6:
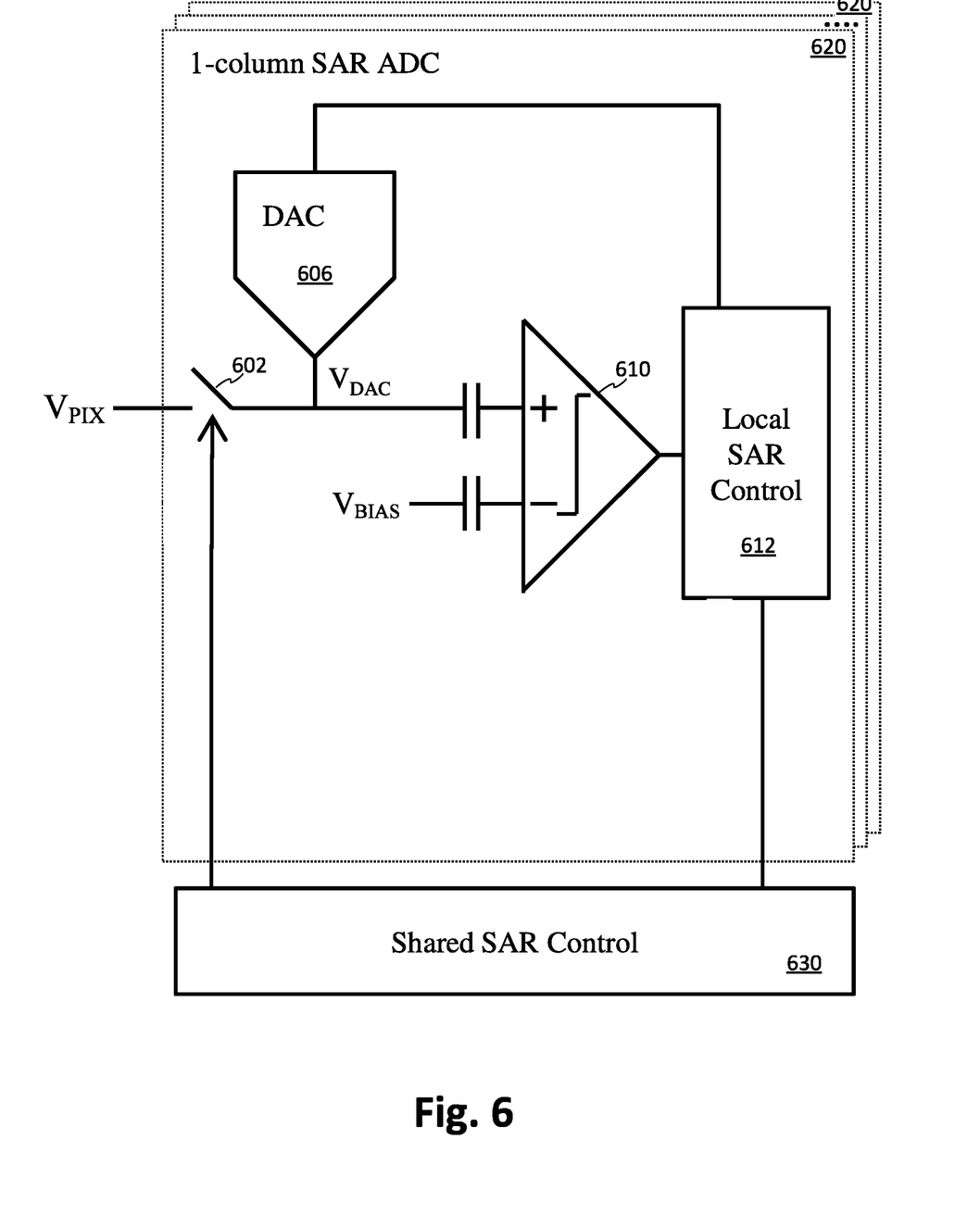
FIG. 6 is a second example 1-column SAR ADC that has a comparator of two differential inputs and a single DAC to convert pixel analog voltage $V_{PIX}$ to digital image signal in accordance with an embodiment of the present disclosure.

A shared SAR control block 630 shown in FIG. 6 controls an input sampling switch 602 and timing of the successive approximation switching algorithm of all column ADCs 620.

Figure 7:
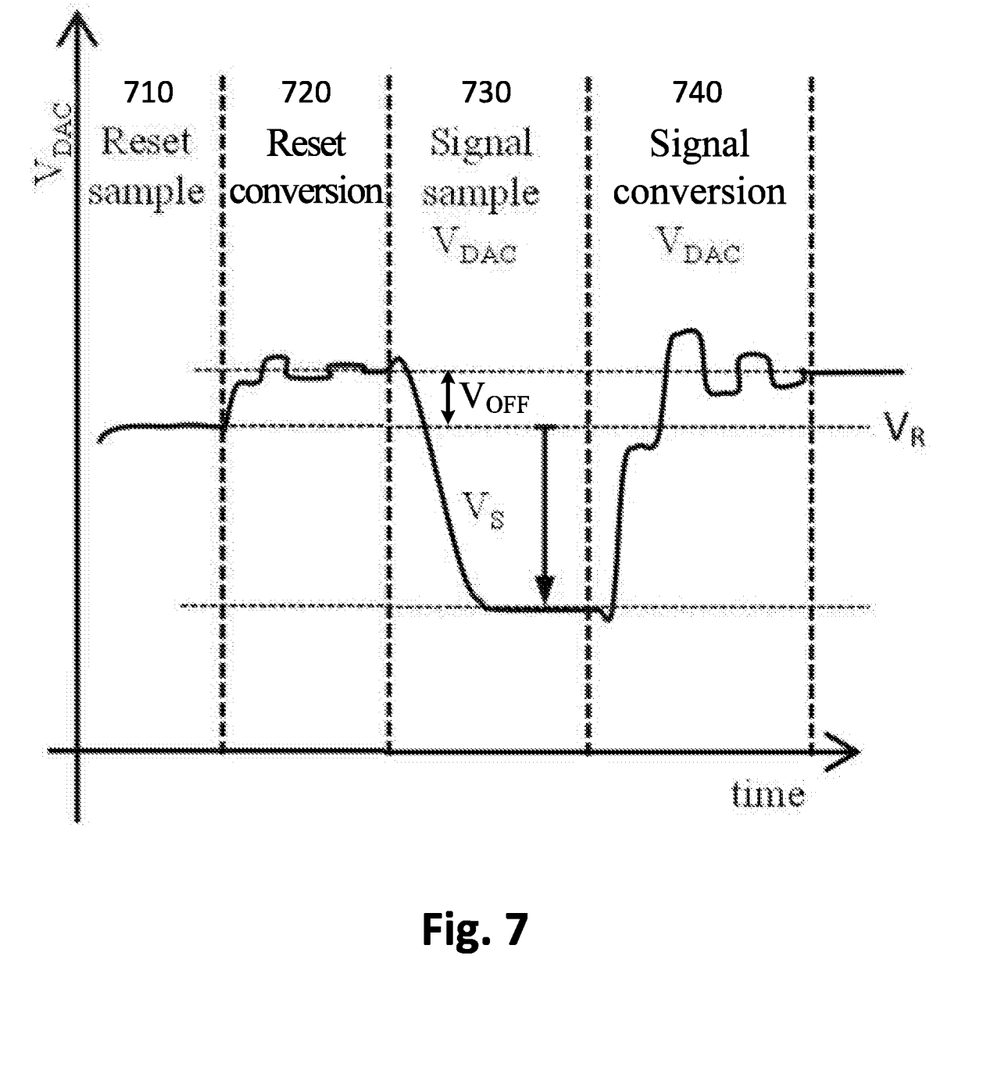
FIG. 7 is a second example waveform in association with the operation of the 1-column SAR ADC in an imaging sensor in dealing with arithmetic calculation in associate with the circuit of FIG. 6 in accordance with an embodiment of the present disclosure.

The disclosed one-pixel DCDS readout is performed in four phrases as illustrated in FIG. 7. Firstly, the differential reset signal is sampled onto the differential ADC input during the "Reset sample" phase 710 with a bias voltage being introduced to the inverting input of the comparator 610. The DAC is initialized with non-zero $P_I - P_{nI}$ during reset sampling. The comparator 610 is again reset during this phase, prior to opening the sampling switches 602.

During the "Reset conversion" phase 720, the comparator input successively approximates the comparator 610 trigger point by stepping DAC (refer to the wiggling waveform of $V_{DAC}$ during Phase 720 in FIG. 7). The final DAC code increases from the "Reset conversion" phase 720 by $D_R$ (a reset digital value) and the comparator is close to its trigger point. As the comparator 610 approaches its trigger point, as can be seen from Table 2, DAC code has been adjusted from $P_I-P_{nI}$ to $P_I+D_R$. The value of $V_{DAC}$, as a result, is set from $V_R$ to $V_R+\Delta V(D_R)+\Delta V(P_{nI})$ to minimize the quantization error of $V_{DAC}-V_{BIAS}$ to $V_{QR}$, where $V_{QR}$ is less than $\Delta V(LSB)$, as found in Table 2, at the end of the conversion of Phase 720.

TABLE 2

Principal algorithm with DAC codes and voltages

| Phase | DAC code | $V_{DAC}$ | $V_{BIAS}$ | $V_{DAC} - V_{BIAS}$ |
|---|---|---|---|---|
| 710 | $P_I - P_{nI}$ | $V_R$ | $V_{BIAS}$ | |
| 720 | $P_I + D_R$ | $V_R + \Delta V(D_R) + \Delta V(P_{nI})$ | $V_{BIAS}$ | $V_{QR}$ |
| 730 | $P_I - D_R$ | $V_R - V_S$ | | |

TABLE 2-continued

Principal algorithm with DAC codes and voltages

| Phase | DAC code | $V_{DAC}$ | $V_{BIAS}$ | $V_{DAC} - V_{BIAS}$ |
|---|---|---|---|---|
| 740 | $D_S$ | $V_R - V_S - \Delta V(P_I) + \Delta V(D_R) + \Delta V(D_S)$ | $V_{BIAS}$ | $V_{QS}$ |

In the third phase 730, the sampling switch 602 is opened in order to sample the column pixel voltage onto $V_{DAC}$. Again, the pixel charge transfer occurs during or before this phase. The $V_{DAC}$ voltage is reduced by $V_S$ compared to the sampled reset voltage as can be seen from FIG. 7. During the sampling phase 730, the DAC holds a code of $P_I-D_R$, in order to compensate for the comparator offset. The selection of $P_I-D_R$ to DAC is the essence of this present disclosure. It makes the DAC do the math and removed an arithmetic subtraction between the offset caused by the reset and the signal (as indicated by equation (1)) normally takes place at a later time. This is made possible because the offset voltage $\Delta V(D_R)$ represented by the DAC code $D_R$ is cancelled out from the final calculation if method hereby disclosed is used.

In the final "Signal conversion" phase 740, DAC is successively stepped (refer to the wiggling waveform of $V_{DAC}$ during Phase 740 in FIG. 7) in order to approximate the column pixel charge. The final DAC code from this phase is $D_S$. As the comparator reaches its trigger point, as can be seen from Table 2, DAC code has been adjusted from PI-DR to DS. The value of $V_{DAC}$, as a result, is set from $V_R-V_S$ to $V_R-V_S-\Delta V(P_I)+\Delta V(D_R)+\Delta V(D_S)$ to minimize the quantization error of $V_{DAC}-V_{BIAS}$ to $V_{QS}$, where $V_{QS}$ is less than $\Delta V(LSB)$, as found in Table 2, at the end of the conversion of Phase 740.

The information from Table 2 may be concluded as:

$$\Delta V(D_S) = V_S + V_{QS} - V_{QR} + \Delta V(P_I) + \Delta V(P_{nI}) \quad (7)$$

Equations (7) show that the output code $D_S$ represents the delta (refer to equation (1)) pixel signal $V_S$, offset by the initial codes $P_I$ and $P_{nI}$ used during the reset sampling phase. Due to the digital CDS operation, each output also includes two quantization errors.

The reset caused offset $\Delta V(D_R)$ is, however, not appeared in equation (7). That means the DCDS method provides the DCDS result directly without the need for an arithmetic operation to calculate the subtraction of the reset value from the signal value in the digital domain. That also means that the DCDS method reduces the signal processing needed for decoding of redundancy (in case where an ADC with redundancy is used). To conclude, the disclosed method reads each pixel with 2 ADC conversions, without the need to arithmetically calculate the difference between the signal conversion and reset conversion.

Figure 8:
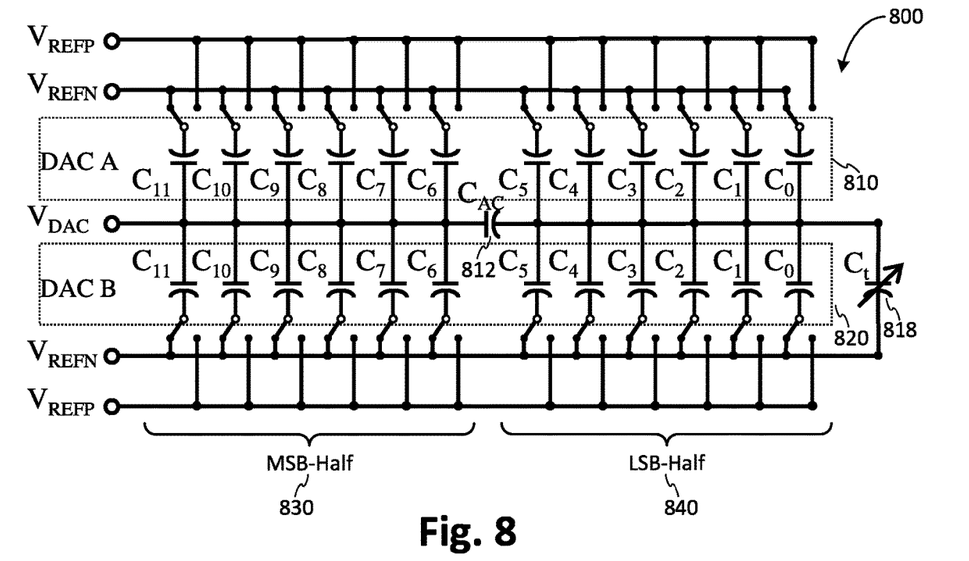
FIG. 8 is a detailed circuitry of DAC in associate with the SAR ADC of FIG. 2 and FIG. 6 in accordance with an embodiment of the present disclosure.

Each charge redistribution DAC 206, 208, 606 is implemented as a split-capacitor DAC 800 with top-plate sampling as shown in FIG. 8. The most significant bit in the capacitor array has been replaced by a copy of the rest of the capacitor array. The DAC 800 therefore consists of two sub-DACs, DAC A 810 and DAC B 820. The two sub-DACs have equal weights. This approach provides several benefits. First, it allows the successive approximation switching algorithm to be implemented energy efficiently. By initializing DAC A 810 and DAC B 820 such, since the bit switching occurs without trial-and-error, where in trial-and-error mode for a SAR ADC, a bit is preset in a trial, tested with comparator, conditionally reset, and set again based on output value of the comparator, etc. Using both DAC A 810 and DAC B 820 allows ADC approximation always moving in the correct direction (720 and 740 in FIG. 7) by using a test, conditional set, test, conditional set algorithm. In each SAR step, a bit (of either DAC A 810 or DAC B 820) can be modified in the desired direction as a result of the comparator output. In the more traditional single DAC approach, a bit must first be modified, and then possibly modified backward (like in a trial) based on the comparator result. Further, it enables a simple way to negate the reset conversion result to DAC0 in Phase 320 without the need for arithmetic operations. Such a benefit is demonstrated by Equations (5) and (6).

DAC A 810 and DAC B 820 may be interleaved in a sense that DAC A bit(n) is next to DAC B bit(n) and DAC A bit(n+1) next to DAC B bit(n+1).

The relative capacitor size of $C_0$ through $C_{11}$ is shown in Table 3. The LSB capacitor $C_0$ is approximately 8 fF, including parasitic capacitance. The AC coupling split capacitor $C_{AC}$ 812 is shared between the two half-DACs (MSB-Half 830 and LSB-Half 840), and a possible value may put $C_{AC}=4C_0$, where MSB is the most significant bit of an N bits digital value. A variable-size capacitor $C_t$ 818 is used to tune the ratio between the MSB-Half 830 and LSB-Half 840 of the DAC, such that the weight $w_6=2 \cdot w_5$. Note that $w_n$ denotes the ideal bit weight, while the actual weight may vary due to mismatch and parasitic capacitance.

TABLE 3

Non-binary DAC relative capacitor size and weight

| | Bit | | | | | | | | | | | |
|---|---|---|---|---|---|---|---|---|---|---|---|---|
| | 11 | 10 | 9 | 8 | 7 | 6 | 5 | 4 | 3 | 2 | 1 | 0 |
| $C_n/C_0$ | 26 | 14 | 7 | 4 | 2 | 1 | 8 | 5 | 3 | 2 | 1 | 1 |
| $w_i$ | 416 | 224 | 112 | 64 | 32 | 16 | 8 | 5 | 3 | 2 | 1 | 1 |

In a different embodiment, the number of DAC bits and their weight may be different from what described in Table 3. Additionally, the number of AC coupling capacitors may be larger than one, and the relative weight between each bit may be non-integer weighted. For instance, the weight may be implemented such that $(w_{i+1}/w_i)$ is a fixed, non-integer ratio smaller than 2.

The negative voltage reference $V_{REFN}$ is connected to signal ground, while the positive voltage reference $V_{REFP}$ is driven by an internal voltage reference generator. The voltage reference settling requirements are significantly relaxed due to the redundancy in the DAC, which allows for faster conversion and reduced energy consumption.

In an example, some ADC design parameters are listed in Table 4. The combined DAC range of both sub-DACs, DAC A and DAC B, is 1768 LSBs, or 10.79 bits.

TABLE 4

ADC Design Parameters

| Parameter | Value |
|---|---|
| Reset conversion steps | 10 |
| Signal conversion steps | 12 |
| $P_n$ randomization bits | 6 |
| DAC range | 1768 LSBs |
| Minimum output DCDS range | 1280 LSBs |

Figure 9:
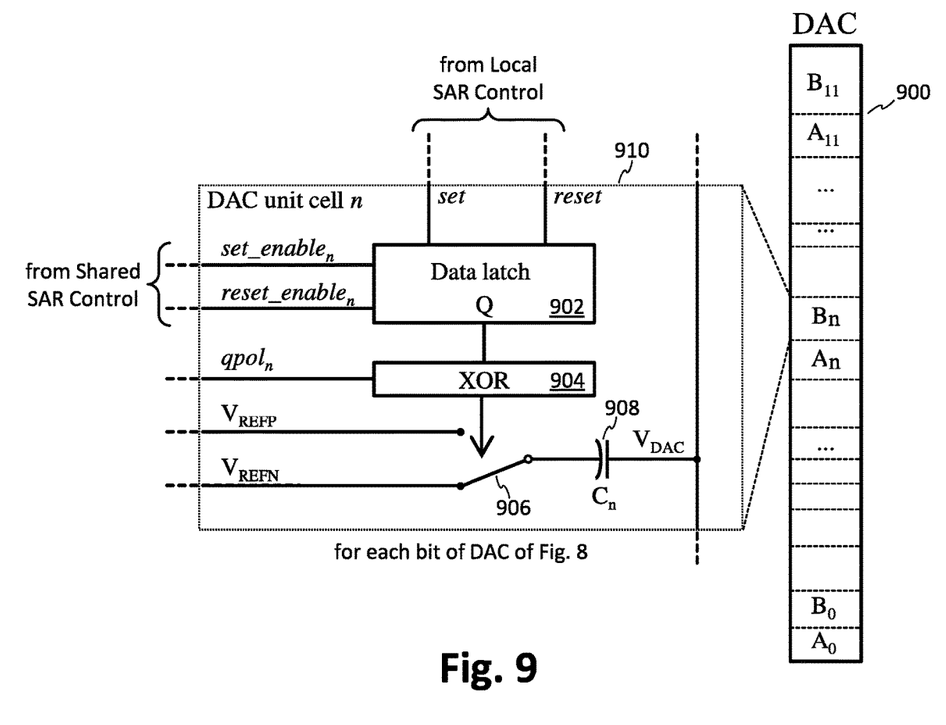
FIG. 9 is a detailed circuitry of each DAC unit cells in associate with the DAC of FIG. 8 in accordance with an embodiment of the present disclosure.

The disclosed algorithm is implemented in a 2.8 μm pitch CMOS image sensor. Each DAC 900 is therefore 2.8 μm wide (to match the pixel width) and 423 μm high. It consists of 24 DAC unit cells—12 for each of the sub-DACs. That is, $A_0$-$A_{11}$ for DAC A 810 and $B_0$-$B_{11}$ for DAC B 820, as shown in FIG. 9.

Each DAC unit cell 910 includes a data latch 902, an XOR-gate 904, a voltage switch 906 and a capacitor 908 of variable size. The vertically routed set and reset signals are driven by the local SAR control circuitry 212 shown in FIG. 2, while the horizontally routed set_enable$_n$ and reset_enable$_n$ signals are controlled by the shared SAR control circuitry 214. The latch operation is gated by the corresponding enable signals, in order to access individual data latches 902 inside the DAC. The qpol$_n$ signal (n is an integer between 0 and N), when set to 1, is used to invert (through the XOR gate 904) the latch output Q before being applied to the voltage switch 906. The qpol signals are routed separately for odd and even column DACs, while sub-DACs A and B share the same N-bit input.

The DAC switching algorithm is implemented in order to minimize the switching energy and minimize the complexity of the control logic. The principal algorithm as defined in Table 1 is implemented using the DAC switching as defined in Table 5. Parameters with their typical values are listed in Table 6. The parameters shown in Table 6 are for demonstration purpose only, they may not be considered as values limited to Table 6 only. It may also be possible to implement other variants of the switching algorithm, for instance swapping the sub-DACs A and B or swapping the order of odd versus even columns.

TABLE 5

DAC switching algorithm

| Phase | QPOL | A0 | B0 | A1 | B1 |
|---|---|---|---|---|---|
| 1. Sampling | RM | RM | PN | RM | PN |
| 2. Reset conversion initialization | | RM | 0 | | |
| 2. Reset conversion complete | | $D_R$ | $D_R$ & ~1 | | |
| 3. Odd sampling | | | | | |
| 4. Odd conversion initialization | | | | DM | 0 |
| 4. Odd conversion complete | | | | $D_1$ \| 1 | $D_1$ |
| 5. Even sampling | 0 | | | | |
| 6. Even conversion initialization | | DM | 0 | | |
| 6. Even conversion complete | | $D_0$ & ~1 | $D_0$ | | |

Each bit corresponding n-th bit of $A_0$-$A_{11}$ and $B_0$-$B_{11}$ in DAC A and DAC B can be swapping back and forth, meaning for any given bit of any DAC, it can be implemented either in DAC A or DAC B randomly in order to reduce the ADC differential non linearity (DNL) performance. The two equal weight least significant bits $w_0$ and $w_1$ (corresponding to capacitors $C_1$ and $C_0$), where $w_0$ may equal to $w_1$, may also be swapped randomly during conversion. To expand the flexibility further, columns in any given row can also be swapped randomly among different ADCs.

TABLE 6

ADC and DAC parameters

| Parameter | Typical Value | Comment |
|---|---|---|
| RB | 10 | Number of Reset Bits |
| RM | (2 ^ RB) − 1 = 1023 | Reset mask |
| DB | 12 | Number of Data Bits |

TABLE 6-continued

ADC and DAC parameters

| Parameter | Typical Value | Comment |
|---|---|---|
| DM | (2 ^ DB) − 1 = 4095 | Data mask |
| PB | 6 | Number of randomization bits |
| PN | [0, (2 ^ PB) − 1] | Per-row randomized offset |
| $D_R$ | [0, RM] | Reset conversion result |
| $D_0, D_1$ | [0, DM] | Signal conversion result |
| $R(D_0)$, $R(D_1)$ | [0, 1768] | Redundancy decoded signal conversion results |

The DAC randomization may be implemented pseudo randomly using a linear feedback shift register (LFSR) which is updated at each readout of a pixel row.

DAC switching algorithm shown in Table 5 can be viewed together with Table 1 to demonstrate how the DAC operates by exercising their DAC codes A0, B0, A1, and B1.

In Phase 1 of Table 5, during Sampling process, QPOL is set to RM for the even columns while QPOL is zero for the odd columns. In one example based on Table 6, RM is set to a typical value of 1023=10'b11_1111_1111 (all binary 1's). A0 and A1 are set to RM=1023, B0 and B1 are set to PN which is a randomized value between 0 and 63.

In Phase 2, Reset process, during conversion initialization, A0 is maintained at RM=1023 and B0 is set to 0 from PN. During conversion process, the comparator 210 brings both A0 (down from 1023) and B0 (up from 0) to values around midway between 0 and RM=1023, where A0=DR and B0=(DR & ~1). Where (DR & ~1) denotes that every bit of DR and (DR & ~1) are the same except (DR & ~1) has its bit[0] value always equals to 0. Which means that for any given DR, its value is equal or larger than that of (DR & ~1).

In Odd Phase 4, during conversion initialization, A1 is set to DM=4095 and B1 is set to 0 from PN. During conversion process, the comparator brings both A1 (down from 4095) and B1 (up from 0) to values around midway between 0 and DM=4095, where A1=(D1|1) and B1=D1. Where (D1|1) denotes that every bit of D1 and (D1|1) are the same except (D1|1) has its bit[0] value always equals to 1. Which means that any value of (D1|1) is equal or larger than that of D1.

In Even Phase 5, value of QPOL is set from RM=1023=10'b11_1111_1111 (all 10 binary bits are 1's) to 0=10'b00_0000_0000 (all 10 binary bits are 0's). That means that logic inverting operation acted to Phase 1 through 4 has been removed or negated. During Phase 1 through 4, A0/A1 equal or larger than B0/B1 (by the might be difference only to the LSB bit[0]) means VDAC0>VDAC1, it means that the comparator output was used to decrease VDAC0 and increase VDAC1. The flip of every bit of QPOL means that the comparator output is going to be used to increase VDAC0 and decrease VDAC1, as will be seen in Phase 6 of Table 5.

In Even Phase 6, during conversion initialization, A0 is set to DM=4095 from $D_R$ and B0 is set to 0 from ($D_R$ & ~1) of Phase 2. During conversion process, the comparator brings both A0 (down from 4095) and B0 (up from 0) to values around midway between 0 and DM=4095, where $A_0$=($D_0$ & ~1) and B0=D0. Since ($D_0$ & ~1) denotes that every bit of $D_0$ and ($D_0$ & ~1) are the same except ($D_0$ & ~1) has its bit[0] value always equals to 0. That means the value of B0=$D_0$ is equal or larger than that of A0=($D_0$ & ~1). The comparator was told to increase B0=VDAC1 and decrease A0=VDAC0 before balance was achieved.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A CMOS image sensor, comprising:
a pixel array including a plurality of 4T pixels, wherein each 4T pixel comprises a photo diode (PD) that generates image charges in response to incident light, a transfer (TX) transistor, a reset (RST) transistor, a source follower (SF) transistor, and a row select (RS) transistor, and wherein the SF transistor is coupled between the PD and the RS transistor to convert the PD generated image charges to an image output voltage;
a plurality of readout columns;
a plurality of bias current sources coupled to the readout columns, wherein each bias current source provides bias current to the SF transistor through the readout column;
a plurality of readout circuitry coupled to the readout columns to read out an image data from the pixel array, wherein each readout circuitry comprises a first sampling switch and a successive approximation register (SAR) analog-to-digital converter (ADC), wherein the SAR ADC comprises a differential comparator, a local SAR control, and a first digital-to-analog converter (DAC), wherein the first sampling switch is coupled between a first readout column and a non-inverting input of the differential comparator, and wherein the first DAC is coupled between the local SAR control and the non-inverting input of the differential comparator; and wherein each readout circuitry further comprises a bias voltage, wherein the bias voltage is coupled to an inverting input of the differential comparator, to form a 1-column SAR ADC; and
a shared SAR control, wherein the shared SAR control controls a sampling switch, and timing of the successive approximation switching algorithm of a plurality of SAR ADCs of the pixel array.

2. The CMOS image sensor of claim 1, wherein the first DAC is a charge redistribution DAC, wherein the charge redistribution DAC consists of two sub-DACs and comprises a plurality of voltage distribution DAC unit cells, an AC coupling split capacitor shared between the two half-DACs, wherein each half-DAC has the same number of the DAC unit cells, and a variable-size capacitor coupled between the node where one end of the AC coupling split capacitor connects to least significant bit (LSB) capacitors and a negative voltage reference.

3. The CMOS image sensor of claim 2, wherein the two sub-DACs have the same number of DAC unit cells and the same distribution of bit weights.

4. The CMOS image sensor of claim 2, wherein the DAC unit cell comprises a data latch coupled to a first input of an XOR gate, wherein an inverting signal is coupled to a second input of the XOR gate, wherein an output of the XOR gate is coupled to a voltage switch to determine what voltage to input to a voltage distribution capacitor, and wherein the voltage distribution capacitor contributes its voltage to a DAC output based on what voltage the capacitor receives.

5. An image readout method for reading one pixel with two conversions, comprising:

setting a bias voltage to an inverting input of the comparator;

resetting a comparator of an ADC;

turning on a first sampling switch to sample an reset voltage from a readout column to a non-inverting input of the comparator;

setting a first DAC to a first initial value;

stepping digital values of the first DAC to reach a first digital value of the first DAC when the comparator triggers a first time, wherein the first digital value is a summation of the first initial value and a reset digital value;

transferring pixel charges from photo diodes of a pixel row under read to a readout column;

turning on the first sampling switch to sample a first signal voltage from the readout column to the non-inverting input of the comparator, wherein a voltage of the non-inverting input of the comparator reduces by a first signal voltage from the first initial voltage corresponding to the first initial value of the first DAC;

setting a first DAC to a subtraction of the reset digital value from the first initial value to compensate for a comparator offset; and stepping the digital values of the first DAC to reach a second digital value corresponding to the first DAC when the comparator triggers a second time.

6. An image readout method of claim 5, wherein the first initial value is set to a value to allow conversion of the comparator offset without saturation.

7. An image readout method of claim 5, wherein the second digital value represents a digital image signal of the readout column, offset by the first initial voltage corresponding to the first initial value of the first DAC.

8. An image readout method of claim 5, wherein the difference between the first digital value and the first initial value is the reset digital value, and wherein based on the comparator triggering the first time, a first quantization error between the output voltages of the first DAC and the bias voltage is minimized to less than the first DAC voltage corresponding to the least significant bit (LSB).

9. An image readout method of claim 5, wherein based on the comparator triggering the second time, a second quantization error between the output voltages of the first DAC corresponding to the second digital value and the bias voltage is minimized to less than the first DAC voltage corresponding to the LSB.

* * * * *